US009064441B2

(12) United States Patent
Cho et al.

(10) Patent No.: US 9,064,441 B2
(45) Date of Patent: Jun. 23, 2015

(54) DISPLAY APPARATUS AND THE DISPLAY METHOD THEREOF

(71) Applicant: SAMSUNG ELECTRONICS CO., LTD., Suwon-si (KR)

(72) Inventors: Young-hoon Cho, Seoul (KR); Ji-yong Park, Suwon-si (KR); Sang-kyun Im, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 181 days.

(21) Appl. No.: 13/727,013

(22) Filed: Dec. 26, 2012

(65) Prior Publication Data

US 2013/0182004 A1 Jul. 18, 2013

(30) Foreign Application Priority Data

Jan. 12, 2012 (KR) ........................ 10-2012-0004018

(51) Int. Cl.

| | |
|---|---|
| ***G09G 5/00*** | (2006.01) |
| ***G09G 5/02*** | (2006.01) |
| ***H04N 1/46*** | (2006.01) |
| ***G03F 3/08*** | (2006.01) |
| ***G06K 9/40*** | (2006.01) |

(52) U.S. Cl.

CPC .................. *G09G 5/02* (2013.01); *G09G 5/003* (2013.01); *G09G 2310/0232* (2013.01); *G09G 2310/04* (2013.01); *G09G 2320/043* (2013.01)

(58) Field of Classification Search

USPC ......... 345/581, 589, 594, 600, 606, 611, 619, 345/441–443; 358/518–520, 530, 537–538, 358/452–453; 382/254, 266, 274, 276, 282, 382/311; 715/700, 764; 725/37

See application file for complete search history.

(56) References Cited

U.S. PATENT DOCUMENTS

| | | | | |
|---|---|---|---|---|
| 6,686,936 | B1 * | 2/2004 | Nason et al. | 715/778 |
| 7,024,035 | B1 * | 4/2006 | Enomoto | 382/167 |
| 7,864,203 | B1 | 1/2011 | Fear et al. | |
| 2002/0067429 | A1 * | 6/2002 | Nason et al. | 348/556 |
| 2002/0180812 | A1 | 12/2002 | Kim et al. | |
| 2007/0291047 | A1 * | 12/2007 | Harville et al. | 345/589 |
| 2008/0122857 | A1 * | 5/2008 | Hsuan | 345/589 |
| 2009/0201310 | A1 * | 8/2009 | Weiss | 345/594 |

(Continued)

FOREIGN PATENT DOCUMENTS

EP 1 814 098 A1 8/2007

OTHER PUBLICATIONS

Communication dated Apr. 26, 2013 issued by the European Patent Office in counterpart European Patent Application No. 12198916.4.

(Continued)

*Primary Examiner* — Wesner Sajous
(74) *Attorney, Agent, or Firm* — Sughrue Mion, PLLC

(57) ABSTRACT

A display apparatus is provided. The display apparatus includes an image receiver for receiving an image signal; a data processor for generating an image frame by processing the image signal; a display unit for displaying the generated image frame; a User Interface (UI) generator for generating and displaying a UI to select a correction region in the displayed image frame; and a controller for controlling the data processor to generate an image frame with a corrected display attribute, using a preset correction value with respect to the selected correction region.

33 Claims, 5 Drawing Sheets

(56) References Cited

U.S. PATENT DOCUMENTS

| | | | | |
|---|---|---|---|---|
| 2010/0271549 | A1 | 10/2010 | Kuwabara et al. | |
| 2010/0281366 | A1* | 11/2010 | Langmacher et al. | 715/716 |
| 2011/0093887 | A1 | 4/2011 | Jang et al. | |
| 2012/0210222 | A1* | 8/2012 | Matsuda et al. | 715/716 |
| 2012/0210229 | A1* | 8/2012 | Bryant et al. | 715/723 |
| 2012/0210231 | A1* | 8/2012 | Ubillos et al. | 715/723 |
| 2012/0299971 | A1* | 11/2012 | Hotelling et al. | 345/690 |
| 2013/0346897 | A1* | 12/2013 | Warner et al. | 715/769 |
| 2014/0184589 | A1* | 7/2014 | Vesely | 345/419 |

OTHER PUBLICATIONS

Communication dated Mar. 12, 2015, issued by the European Patent Office in counterpart European Application No. 12198916.4.

* cited by examiner

DISPLAY APPARATUS AND THE DISPLAY METHOD THEREOF

CROSS-REFERENCE TO RELATED APPLICATIONS

This application claims the benefit of priority under 35 U.S.C. §119 (a) from the Korean Patent Application No. 10-2012-0004018, filed on Jan. 12, 2012 in the Korean Intellectual Property Office, the entire disclosure of which is incorporated herein by reference in its entirety.

BACKGROUND

1. Field

Exemplary embodiments generally relate to a display apparatus and a display method thereof. More particularly, exemplary embodiments relate to a display apparatus for compensating for an image signal and a display method thereof.

2. Description of the Related Art

As time passes, a display device can differently represent color attribute values such as luminance uniformity and color uniformity of the whole screen because of optical characteristics or deterioration. Such luminance degradation and color distortion are irrelevant to an image frame and, in particular, occur around an edge of the display.

FIG. 1 depicts uneven luminance on a display screen in a Related Art.

Referring to FIG. 1, the luminance is partially degraded around the edge of the display device and its output is relatively darker than the center portion. When a plurality of display devices is equipped as shown in FIG. 1, for example, when multiple display devices such as a video wall are equipped consecutively, the luminance degradation or the color distortion near the border between the display devices can make the whole image output from the multiple display devices seem unnatural.

To address this output problem of the uneven display screen, it is necessary to correct the luminance degradation or the color distortion in a particular region.

SUMMARY

Therefore, it is an aspect to solve the above-mentioned and/or other problems. It is further an aspect to provide a display apparatus for addressing an unnatural output image by correcting partial luminance degradation or color distortion of the display apparatus, and a display method thereof.

According to an aspect, a display apparatus includes a data processor which generates an image frame by processing an image signal; a User Interface (UI) generator which generates a UI to be displayed for a selection of a correction region in the generated image frame; where the data processor further generates a corrected image frame with a corrected display attribute, by applying a correction value to the selected correction region.

The apparatus may further include an image receiver which receives an image signal, a display unit which displays the generated image frame and the corrected image frame, and a controller which controls the data processor to generate the corrected image frame. The UI generator may further generate a second UI to select a correction value for the display attribute of the selected correction region, and the controller may control the data processor to generate the corrected image frame with the corrected display attribute, using the correction value selected on the second UI applied to the selected correction region.

The data processor may calculate a gain for the display attribute according to the selected correction value, and where the data processor corrects a display attribute value of the image frame by multiplying the display attribute value of the image frame by the calculated gain.

The data processor lowers the display attribute value of the image frame forming the corrected display attribute value. When the selected correction regions in the image frame are discontinuous, the data processor may calculate a correction value for a region between the selected correction regions using a correction value of the selected correction region.

The display attribute may be at least one of a luminance value, a red (R) color value, a green (G) color value, and a blue (B) color value.

The display apparatus may further include a display unit which displays the generated image frame and the corrected image frame. The correction region is obtained by the data processor receiving a selection indication a portion of the displayed generated image frame.

The display apparatus may further include a display unit which displays the generated image frame and the corrected image frame. The correction region may be obtained by the data processor receiving a selection of at least one of a vertical line and a horizontal line in the displayed generated image frame. The correction region may be an edge region of the generated image frame. The correction region may be a plurality of consecutive vertical lines or a plurality of consecutive horizontal lines located in the generated image frame. The display apparatus may further include a display unit which displays the generated image frame and the corrected image frame. The correction region is obtained by the data processor receiving a shape manipulated within the displayed generated image frame, where the shape corresponds to a shape of the image frame.

The display apparatus may include a plurality of the display units, which display the generated image frame and the corrected image frame. The UI generator may generate a third UI to select an image frame displayed in at least one of the plurality of the display units, as a correction target.

A display method includes generating an image frame by processing an image signal; generating a UI to be displayed for a selection of a correction region in the generated image frame; and generating a corrected image frame with a corrected display attribute by applying a correction value to the selected correction region.

The display method may further include receiving the image signal; displaying the generated image frame; generating a second UI to be displayed for a selection of a correction value for the display attribute of the selected correction region, where the generating the corrected image frame include generating the corrected image frame with the corrected display attribute using the correction value selected on the second UI applied to the selected correction region; and displaying the corrected image frame.

The generating the corrected image frame may include calculating a gain for the display attribute according to the selected correction value, and correcting a display attribute value by multiplying the display attribute value of the image frame by the calculated gain.

The generating the corrected image frame may further include lowering the display attribute value of the image frame forming the corrected display attribute value.

When selected correction regions are discontinuous, the generating the corrected image frame includes calculating a correction value for a region between the selected correction regions using a correction value of the selected correction region.

The display attribute may be at least one of a luminance value, a red (R) color value, a green (G) color value, and a blue (B) color value. The method may further include displaying the generated image frame, and in response to receiving the selected correction region, displaying the corrected image frame, where the selected correction region is obtained by receiving a selection indicating a portion of the displayed generated image frame.

The method may further include displaying the generated image frame, and in response to receiving the selected correction region, displaying the corrected image frame, where the correction region may be obtained by receiving a selection of at least one of on a vertical line and a horizontal line in the displayed generated image frame. The correction region may be an edge region of the generated image frame.

The correction region may be a plurality of consecutive vertical lines or a plurality of consecutive horizontal lines located in the generated image frame. The method may further include displaying the generated image frame, and in response to receiving the selected correction region, displaying the corrected image frame, where the correction region is obtained by receiving a shape manipulated within the displayed generated image frame and the shape corresponding to the shape of the image frame.

The display method may display the generated image frame using a plurality of display units. The method may further include generating a third UI to select an image frame displayed in at least one of the plurality of the display units, as a correction target.

BRIEF DESCRIPTION OF THE DRAWING FIGURES

These and/or other aspects will become apparent and more readily appreciated from the following description of exemplary embodiments, taken in conjunction with the accompanying drawings of which:

DETAILED DESCRIPTION

Figure 1:
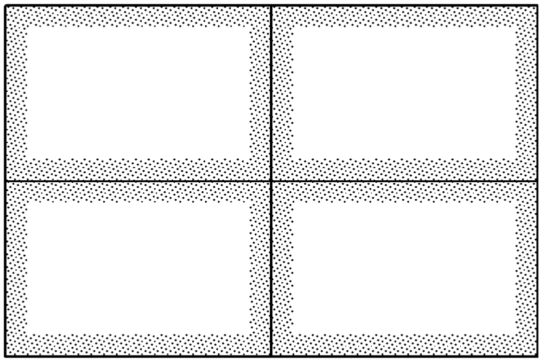
FIG. 1 (RELATED ART)
FIG. 1 is a diagram illustrating uneven luminance on a display screen in a related art.

Reference will now be made in detail to the exemplary embodiments, examples of which are illustrated in the accompanying drawings, wherein like reference numerals refer to the like elements throughout. The exemplary embodiments are described below to further understanding of one of ordinary skill in the art by referring to the figures.

Figure 2:
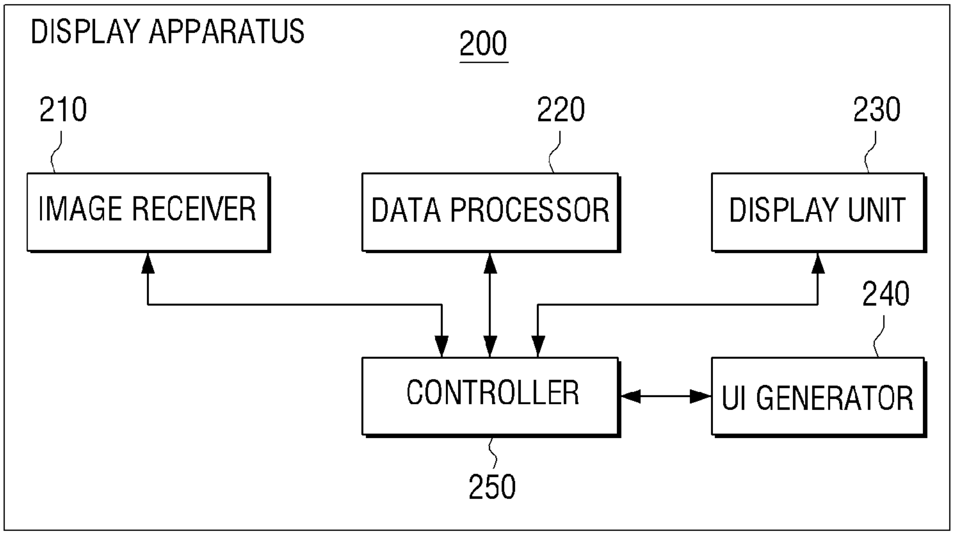
FIG. 2 is a block diagram illustrating a display apparatus according to an exemplary embodiment.

FIG. 2 is a block diagram illustrating a display apparatus according to an exemplary embodiment.

Referring to FIG. 2, the display apparatus 200 includes an image receiver 210, a data processor 220, a display unit 230, a User Interface (UI) generator 240, and a controller 250. It is noted that in an exemplary embodiment, the display apparatus is a combination of hardware and software. For example, the data processor, the display unit, the controller are physical hardware.

The image receiver 210 receives an image signal. The image signal received at the image receiver 210 can be a broadcasting signal or an external input signal from an external source.

The data processor 220 processes the image signal received at the image receiver 210 and generates an image frame. How to generate the image frame by processing the image signal is well known to those skilled in the art and thus a detailed description will be omitted. The data processor 220 can generate an image frame of a corrected display attribute, under the control of the controller 250.

Herein, the display attribute is a color attribute value required to display the image frame. For example, the display attribute can indicate a color component value such as luminance, saturation, and hue. The display attribute can be at least one of the luminance value, the red (R) color value, the green (G) color value, and the blue (B) color value. When the R, G, and B values are corrected at the same time, the luminance of the display screen can be changed. When the R, G, and B values are corrected individually, the color distortion can be corrected. Such a display attribute value generally ranges from 0 to 255.

The display unit 230 displays the image frame generated by the data processor 220. The display unit 230 can display a UI generated by the UI generator 240. Herein, the display unit 230 can be implemented using various devices such as Cathode Ray Tube (CRT), Liquid Crystal Display (LCD), and Plasma Display Panel (PDP).

The UI generator 240 generates and displays a UI for selecting a correction region of the image frame displayed in the display unit 230. When the correction region is selected, the UI generator 240 can further generate and display a UI for selecting a correction value for the display attribute of the selected correction region. In the UI generated on the display unit 230, a user can select the correction region and the correction value of the image frame.

The correction region can be selected and form only a part of the image frame, or the whole image frame displayed in the display unit 230 may be selected. In particular, when the plurality of the display units is equipped, the entire image frame displayed in one display unit can be selected as the correction region. An example of how to select the correction region and the correction value shall be explained in detail.

The controller 250 can control the data processor 220 to generate an image frame of the corrected display attribute using a preset correction value with respect to the selected correction region in the UI. Alternatively, when the correction value for the display attribute of the selected correction region is selected on the UI, the controller 250 can control the data processor 220 to generate the image frame of the corrected display attribute using the selected correction value for the selected correction region.

Meanwhile, the controller 250 can control the operations of the display apparatus 200. That is, the controller 250 can control the image receiver 210, the data processor 220, the display unit 230, and the UI generator 240 to perform the corresponding operations.

Examples of the selections of the correction region on the UI generated by the UI generator 240 and the correction value for the display attribute of the selected correction region are explained in greater detail with reference to FIGS. 3 through 7. The correction region can be one of a plurality of consecutive vertical or horizontal lines, an edge region inside the image frame, the vertical line or horizontal line unit on the image frame, or the line unit which is the same shape as the image frame.

Figure 3:
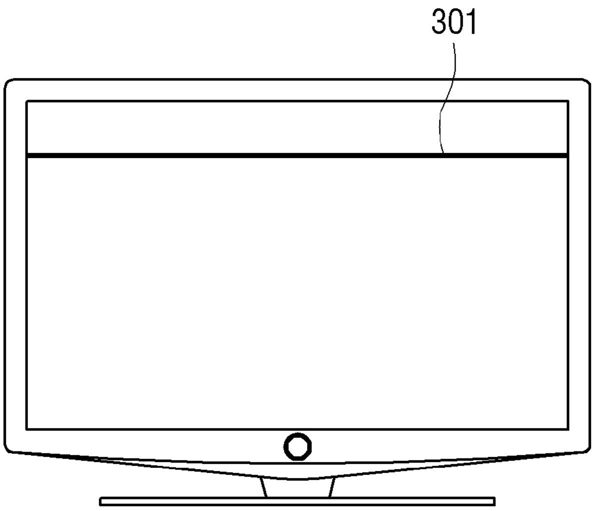
FIG. 3 is a view illustrating a UI for selecting a correction region according to an exemplary embodiment.

FIG. 3 is a block diagram illustrating a UI for selecting the correction region according to an exemplary embodiment.

Referring to FIG. 3, the UI generator 240 generates a horizontal line 301 on the display screen. The user can move the generated horizontal line 301 and select the horizontal line 301 as the correction region.

While only a horizontal line is depicted in FIG. 3 for ease of understanding, not only the horizontal line but also a vertical line may be generated, the vertical line can be selected as the correction region, and both the horizontal and vertical lines may be generated and can be selected as the correction region. Of course, these lines are provided by way of an example only and not by way of a limitation. For example, diagonal lines or even shapes maybe used such as a rectangle that the user may stretch and place to form the correction region.

In an exemplary embodiment, one horizontal line indicates pixels in one row. One vertical line indicates pixels in a column.

When the user moves the horizontal line and selects the line at a particular location, the UI for selecting the display correction value for the selected line 301 can be generated.

Figure 4:
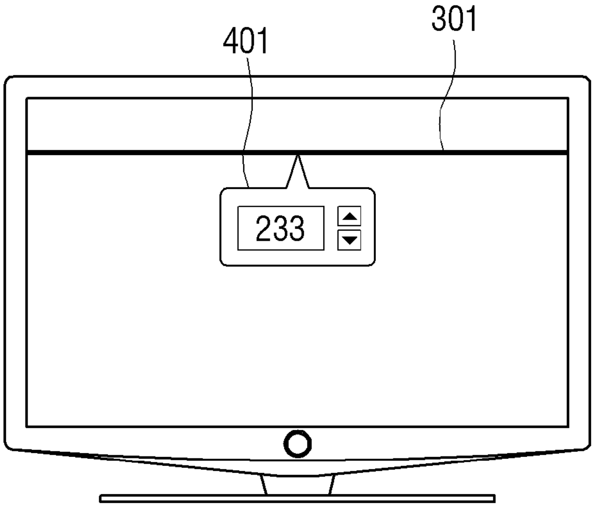
FIG. 4 is a view illustrating a UI for selecting a correction value according to an exemplary embodiment.

FIG. 4 is a view illustrating a UI for selecting the correction value according to an exemplary embodiment.

Referring to FIG. 4, when the user selects the correction region, the UI generator 240 generates a UI 401 for selecting the correction value for the selected horizontal line 301. The user can input the correction value directly through the generated UI, or input the correction value using arrows on the UI.

The correction value may be selected as an absolute value such as 255 or 233 or a relative value such as +3 or −5. While only the correction value selection for the selected correction region is explained in an exemplary embodiment, the user may directly select a gain for the display attribute, rather than the correction value.

By repeating such an operation, the correction values for the plurality of the lines can be selected respectively. However, the user does not have to select the correction value for every line, and may select the correction value for some necessary lines.

Hence, since the user can select the correction values for the plurality of the horizontal or vertical lines respectively, an accurate correction can be accomplished.

While the UI for selecting the correction value is generated on a certain portion of the display screen in addition to the existing UI for selecting the correction region, the UI for selecting the correction value may be newly generated when the existing UI for selecting the correction region disappears.

Figure 5:
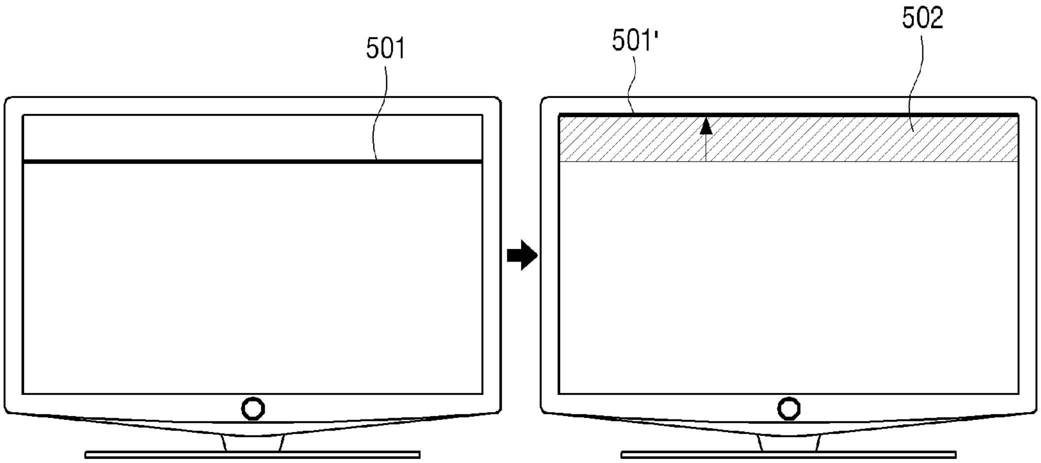
FIG. 5 is a view illustrating another UI for selecting the correction region according to an exemplary embodiment.

FIG. 5 is a view illustrating another UI for selecting the correction region according to an exemplary embodiment.

Referring to FIG. 5, the user can select a region including plurality of consecutive vertical or horizontal lines as the correction region. In detail, the UI generator 240 generates one horizontal line 501 on the display screen. The user can move the horizontal line 501' from a particular location using the horizontal line generated on the display screen and thus select a region 502 including the plurality of the consecutive horizontal lines. Herein, the region including the plurality of the consecutive horizontal lines indicates the region including the horizontal lines consecutively selected.

While the plurality of the consecutive horizontal lines is selected in FIG. 5, a plurality of consecutive vertical lines may also be selected by generating one vertical line on the display screen according to an exemplary embodiment.

When the user selects the region 502 including the plurality of the consecutive horizontal lines, a UI for selecting the correction value for the selection region 502 can be further generated and the selection of the correction value can be performed analogous to an exemplary selection described above with reference to in FIG. 4.

The user can easily select the region including the plurality of the consecutive lines and select a correction value for the selected region.

Figure 6:
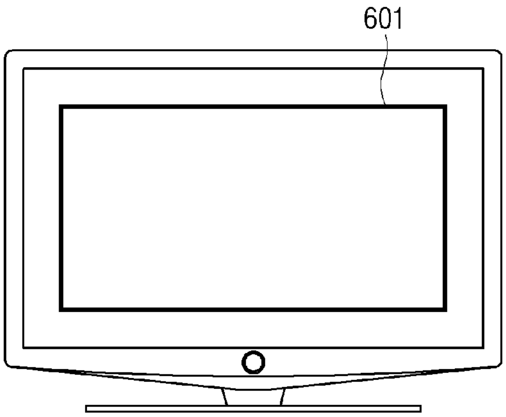
FIG. 6 is a view illustrating yet another UI for selecting the correction region according to an exemplary embodiment.

FIG. 6 is a view illustrating yet another UI for selecting the correction region according to an exemplary embodiment.

Referring to FIG. 6, the UI generator 240 generates a line 601 which is the same shape as the image frame on the display screen. The user can select the generated line 601 as the correction region. When the line is the same shape as the image frame moves toward the center of the display screen, its size can be reduced in response.

In detail, when the user moves and selects the line at a particular location, a UI for selecting the display correction value of the selected line 601 can be generated. The correction value can be selected in an analogous manner described above with reference to FIG. 4.

By repeating the above operation, the correction values can be selected for the plurality of the lines. However, the user does not have to select the correction value for every line generated, and may select the correction value for only some lines for which corrections appear to be necessary.

Hence, since the user can select the correction values for the plurality of the lines respectively, accurate correction can be accomplished.

Figure 7:
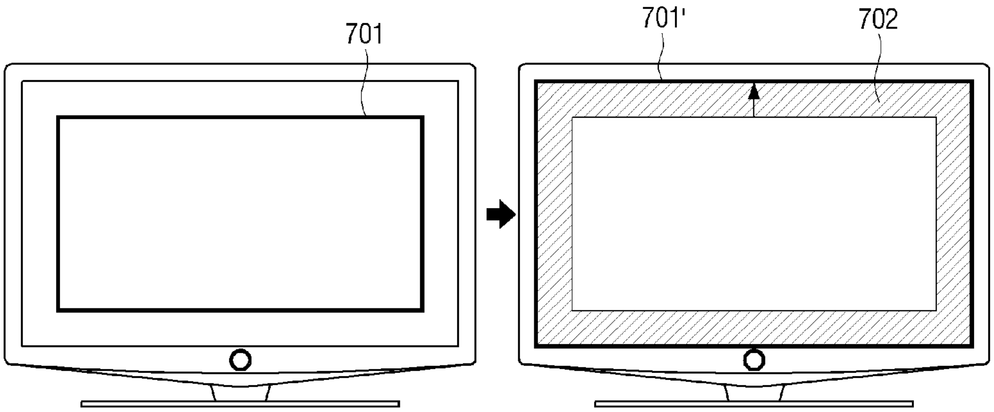
FIG. 7 is a view illustrating another UI for selecting the correction region according to an exemplary embodiment.

FIG. 7 is a view illustrating another UI for selecting a correction region according to an exemplary embodiment.

Referring to FIG. 7, the user can select an edge region inside the image frame as the correction region. Herein, the edge region inside the image frame indicates a region formed by consecutively selecting a number of lines that are the same shape as the image frame.

In detail, the UI generator 240 can generate a line 701 which is the same shape as the image frame along the edge of the display screen. The user can move the generated line 701' and thus select an edge region 702 inside the image frame.

When the user selects the edge region 702 inside the image frame, a UI for selecting the display correction value for the selected region 702 can be generated. The selection of the correction value can be performed in an analogous manner to the exemplary one described above with reference to FIG. 4.

The user can easily correct the image by selecting the edge region and selecting one correction value for the selected region.

An exemplary embodiment of a correction of the image frame generated by the data processor 220 using the correction region and the correction value selected using the UI is described in greater detail below.

The data processor 220 calculates a gain for the display attribute for each pixel of the image frame using the correction value selected using the UI with respect to each pixel of the generated image frame, and corrects the display attribute value of the image frame by multiplying the calculated gain by each pixel. This correction can be conducted under the control of the controller 250.

The data processor 220 can correct the display attribute value of the image value such that the display attribute value falls below the display attribute value before the correction. In detail, the case where the selected correction region is a line and the case where the selected correction region is a region are explained by way of an example.

When the correction region is selected discontinuously, that is, when the line is selected, the data processor 220 calculates the correction value for the region between the selected lines using the correction value of the selected line. Since the correction value for the region between the selected lines is not selected, it can be predicted using the correction value of the selected line or using a numerical method such as interpolation. Preferably, the correction value for the region between the selected lines can be linearly calculated.

Figure 8:
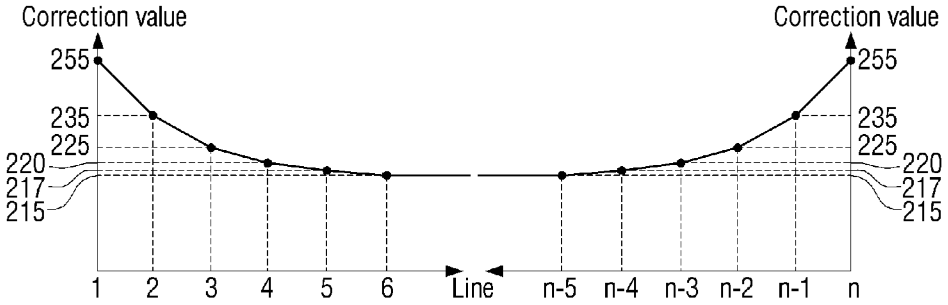
FIG. 8 is a graph illustrating when the correction value is selected for n-ary vertical lines according to an exemplary embodiment.

The calculation of the correction value for the region between the selected lines is described in more detail by referring to FIG. 8.

FIG. 8 is a graph illustrating selection of the correction value for n-ary vertical lines according to an exemplary embodiment.

Referring to FIG. 8, the correction value of the first line is 255, the correction value of the second line is 235, the correction value of the third line is 225, the correction value of the fourth line is 220, the correction value of the fifth line is 217, the correction value of the sixth line is 215, the correction value of the (n-5)-th line is 215, the correction value of the (n-4)-th line is 217, the correction value of the (n-3)-th line is 220, the correction value of the (n-2)-th line is 225, the correction value of the (n-1)-th line is 235, and the correction value of the n-th line is 255.

Herein, when there are 19 lines between the first line and the second line, the lines can have the correction value 254, 253, 252, . . . , 236 respectively. As such, the correction value of every vertical line of each image frame can be calculated.

Using the selected correction value and the calculated correction value, the data processor 220 calculates the gain for the display attribute. The gain for the display attribute can be calculated by using a ratio of a maximum value or a minimum value to the correction values of the image frame, that is, by dividing the correction values by the maximum value or the minimum value.

For example, when the correction value is divided by the maximum value of the correction values of the image frame in FIG. 8, the maximum value is 255 and thus the gain of the first line is 1. The gain of the second line is 235/255 and the gain of the third line is 225/255. In this manner, the gain of every line can be calculated. When the division is based on the maximum value, the gain can range $0<\text{gain}\leq 1$ and the display attribute value of the corrected image frame decreases.

When the division is based on the minimum value and the minimum value is 215, the gain of the first line is 255/215 and the gain of the second line is 235/215. As such, the gain of every line can be calculated. When the division is based on the minimum value, the gain can range as $\text{gain}\geq 1$ and the display attribute value of the corrected image frame increases.

The data processor 220 corrects the display attribute of each pixel using the calculated gain. In detail, the data processor 220 can generate the image frame of the corrected display attribute value by multiplying the display attribute value of each pixel of the generated image frame by the gain of the display attribute corresponding to each pixel.

For example, when the gain is calculated by dividing based on the maximum value of the correction values of the image frame, the pixels corresponding to the first line of the image frame are multiplied by 1 and thus the display attribute value does not change. Since the pixels corresponding to the second line are multiplied by the gain of 235/255, the pixels corresponding to the second line can reduce the display attribute value by 235/255. For example, among the pixels corresponding to the second line of the image frame, the pixel having the display attribute value of 255 reduces the display attribute value from 255 to 235.

As such, when all of the pixels of the image frame are multiplied by the calculated gain, the display attribute value can be corrected with respect to all of the pixels of the image frame. The image frame of the corrected display attribute value can be displayed using the display unit 230.

When the pixels of the image frame are corrected to increase the display attribute value of the image frame includes the pixel having the display attribute value exceeding the maximum value 255, the data processor 220 can accomplish the normal correction by reducing the display attribute value of the image frame.

Meanwhile, even when the relative value is selected as the correction value, a maximum value of the relative values is regarded as the absolute correction value, such as 255, and the correction value of each line is calculated to thus correct the display attribute value, as mentioned above. For example, when the relative correction value of the first line is +10, the correction value of the second line is +5, and the correction value of the third line is +2, the display attribute value of the image frame can be corrected by regarding the correction value of the first line as 255, the correction value of the second line as 250, and the correction value of the third line as 247.

Alternatively, the image frame can be corrected by calculating a relative correction value of the unselected lines using the relative correction value and adding the relative correction value to the image frame without calculating the gain.

While the maximum value and the minimum value of the correction value are 255 and 215, the correction value is not limited these numbers and can vary according to a user input.

When the correction value is selected as the gain, the gain calculation can be omitted and the image frame can be corrected by calculating the gain for the region between the selected lines using the selected gain as stated above and multiplying each pixel of the image frame by the corresponding gain.

When the consecutive lines are selected as the correction region, that is, when the region is selected as the correction region, the image frame of the corrected display attribute value can be generated in an analogous manner. The data processor 220 can correct the image frame with the selected correction value with respect to the selected region without having to calculate the gain using the absolute correction value of the selected region. Alternatively, the data processor 220 can correct the image frame by adding the relative correction value to the image frame without having to calculate the gain using the relative correction value.

Although the consecutive lines are selected as the correction region, when the pixels of the corrected image frame include the pixel having the display attribute value exceeding the maximum value 255, the data processor 220 can perform the normal correction by relatively reducing the display attribute value of the other pixels not to exceed the maximum value 255.

As explained above, the data processor 220 can correct the image frame to increase and decrease the display attribute value of the image frame. Thus, even when the display attribute value of the image frame has the maximum value 255 and it is impossible to increase the display attribute value through the correction, the data processor 220 can naturally correct the uneven display attribute of the display screen by reducing the display attribute value of the image frame.

While the image frame is corrected using the selected correction value of the selected correction region in FIG. 8, the image frame of the corrected display attribute may be generated using the correction value automatically calculated. That is, the correction value can be calculated automatically by comparing the selected correction region and the unselected region. For example, the correction value of the image frame can be calculated automatically by calculating and comparing the display attribute values displayed in the display unit, rather than the image frame.

Meanwhile, the display apparatus 200 can include a plurality of display units 230. In particular, the display apparatus 200 including the plurality of the display units 230 can be realized as a video wall.

In this case, the UI generator 240 can generate and display a UI for selecting the image frame displayed in at least one of the display units, as the correction target, an exemplary embodiment of which will be explained with reference to FIG. 9.

Figure 9:
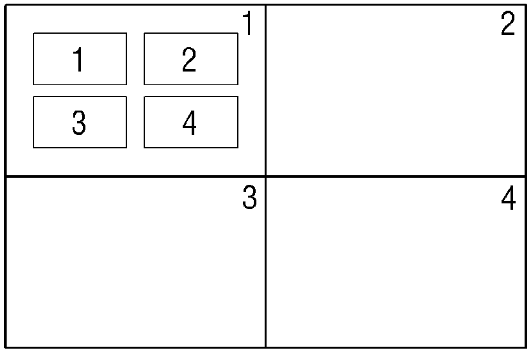
FIG. 9 is a diagram illustrating a UI generated on a display apparatus including a plurality of display units according to an exemplary embodiment.

FIG. 9 is a diagram illustrating a UI generated on the display apparatus including the plurality of the display units according to an exemplary embodiment.

Referring to FIG. 9, the UI generator 240 generates and displays the UI indicating the image frames displayed in the plurality of the display units, in any one of the display units. The user can select at least one of the image frames as the correction target on the UI. When the user selects at least one of the image frames, the selected image frame itself can be selected as the correction region. Alternatively, when the user selects at least one of the image frames, the UI for selecting a partial correction region for the selected image frame may be generated and displayed an example of which is shown in FIGS. 3 through 7.

Figure 10:
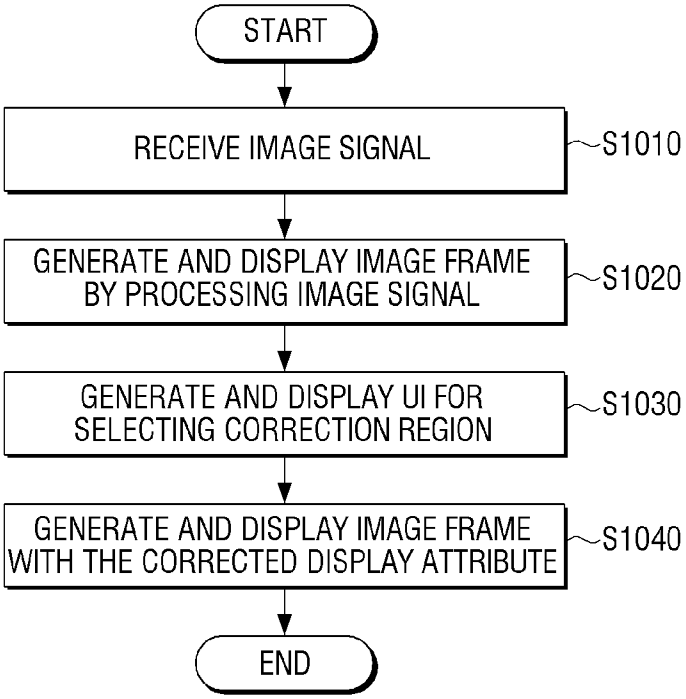
FIG. 10 is a flowchart illustrating a display method of the display apparatus according to an exemplary embodiment.

FIG. 10 is a flowchart illustrating a display method of the display apparatus according to an exemplary embodiment.

Referring to FIG. 10, the display method of the display apparatus includes receiving the image signal (in operation S1010) and generating and displaying the image frame by processing the received image signal (in operation S1020). In the display method, the display apparatus generates and displays the UI for selecting the correction region in the generated image frame (in operation S1030).

Herein, a part of the frame can be selected as the correction region within the displayed image frame. Particularly, the correction region can be selected from the vertical or horizontal line unit, the plurality of the consecutive vertical and horizontal lines, a region that includes a number of lines, a line such as same shape as the image frame, and the edge region inside the image frame.

In the display method, the display apparatus generates and displays the image frame with the corrected display attribute (operation S1040). In detail, in the display method, the display apparatus can generate and display the image frame with the corrected display attribute using the preset correction value with respect to the correction region selected on the displayed UI.

In the operation of generating and displaying the image frame with the corrected display attribute (operation S1040), the display attribute value can be corrected by calculating the gain of the display attribute using the selected correction value and by multiplying the display attribute value of the image frame by the calculated gain. In the display method, the gain can be calculated for the display attribute such that the corrected display attribute value of the image frame falls below the display attribute value before the correction. When the correction region is discontinuous, the correction value for the region can be calculated between the selected correction regions using the correction value of the selected correction region.

Meanwhile, the operation for generating and displaying the UI (operation S1030) can include generating and displaying the UI for selecting the correction value for the display attribute of the selected correction region. User commands for selecting the correction region and the correction value can be input using the generated UI. In the operation of generating and displaying the image frame of the corrected display attribute (operation S1040) the image frame with the corrected display attribute can be generated using the correction value selected on the UI for the selected correction region.

The display apparatus can display the image frame using the plurality of the display units. In the operation of generating and displaying the UI (S1030), the UI for selecting the image frame can be generated and displayed in at least one of the display units as the correction target.

In exemplary embodiments, the correction region may be selected using the vertical or horizontal line unit in the image frame, using the plurality of the consecutive vertical and horizontal lines forming a region, using a shape, and using the edge region in the image frame. These exemplary embodiments are provided by way of an example only and not by way of a limitation, the correction region can be selected in various other ways.

The method according to various exemplary embodiments can be embodied as program codes stored on a recording medium of various types and executable by a CPU of an electronic device.

Specifically, the codes for executing the present method can be stored to various recording media readable by a terminal, such as Random Access Memory (RAM), flash memory, Read Only Memory (ROM), Erasable Programmable ROM (EPROM), Electronically Erasable and Programmable ROM (EEPROM), register, hard disc, removable disc, memory card, USB memory, and CD-ROM.

Although a few exemplary embodiments have been shown and described, it would be appreciated by those skilled in the art that changes may be made in these exemplary embodiments without departing from the principles and spirit of the invention, the scope of which is defined in the claims and their equivalents. As described above, exemplary embodiments are merely exemplary and are not to be construed as limiting. Those skilled in the art can implement various changes and modifications from the above description of exemplary embodiments. Moreover, various modifications to these exemplary embodiments will be readily apparent to those skilled in the art, and the generic principles and specific examples defined herein may be applied to other embodiments.

What is claimed is:

1. A display apparatus comprising:

a data processor which generates an image frame by processing an image signal;

a User Interface (UI) generator which generates a UI to be displayed for a selection of a correction region in the generated image frame; and wherein the data processor further generates a corrected image frame with a corrected display attribute, by applying a correction value to the selected correction region, wherein the generated UI comprises a selection element displayed within the generated image frame, and wherein the selection element is at least one of a line and a shape, which is manipulated by a user within the generated image frame to select the correction region.

2. The display apparatus of claim 1, further comprising:

an image receiver which receives the image signal;

a display unit which displays the generated image frame and the corrected image frame; and a controller which controls the data processor to generate the corrected image frame, wherein the UI generator further generates a second UI to select a correction value for the display attribute of the selected correction region, and wherein the controller controls the data processor to generate the corrected image frame with the corrected display attribute, using the correction value selected on the second UI applied to the selected correction region.

3. The display apparatus of claim 2, wherein the data processor calculates a gain for the display attribute according to the selected correction value, and wherein the data processor corrects a display attribute value of the image frame by multiplying the display attribute value of the image frame by the calculated gain.

4. The display apparatus of claim 3, wherein the data processor lowers the display attribute value of the image frame forming the corrected display attribute value.

5. The display apparatus of claim 1, wherein the display attribute is at least one of a luminance value, a red (R) color value, a green (G) color value, and a blue (B) color value.

6. The display apparatus of claim 1, further comprising a display which displays the generated image frame and the corrected image frame, wherein the correction region is obtained by the data processor receiving a selection using the selection element, the selection indicating a portion of the displayed generated image frame.

7. The display apparatus of claim 1, further comprising a display which displays the generated image frame and the corrected image frame, wherein the selection element is at least one of a vertical line and a horizontal line which is manipulated on the generated image frame to visually define the correction region.

8. The display apparatus of claim 1, wherein the correction region is an edge region of the generated image frame.

9. The display apparatus of claim 1, wherein the correction region is a plurality of consecutive vertical lines or a plurality of consecutive horizontal lines located in the generated image frame.

10. The display apparatus of claim 1, further comprising a display configured to display the generated image frame and the corrected image frame, wherein the selection element is a shape which corresponds to a shape of the generated image frame, which is manipulated on the generated image frame to visually define the correction region.

11. The display apparatus of claim 1, further comprising a plurality of displays which display the generated image frame and the corrected image frame.

12. The apparatus of claim 1, wherein the UI generator further generates a second UI which is displayed within the generated image frame and in which the correction value for the display attribute of the selected correction region is specified.

13. The apparatus of claim 1, wherein the data processor varies a display location of the generated second UI based on the selected correction region.

14. A display apparatus comprising:

a data processor configured to generate an image frame by processing an image signal; and a User Interface (UI) generator configured to generate a UI to be displayed for a selection of correction regions in the generated image frame, wherein the data processor further generates a corrected image frame with a corrected display attribute, by applying a correction value to the selected correction regions, and wherein, when the selected correction regions in the image frame are discontinuous, the data processor calculates a correction value for a region between the selected correction regions using a correction value of the selected correction region.

15. A display apparatus comprising:

a data processor which generates an image frame by processing an image signal;

a User Interface (UI) generator which generates a UI to be displayed for a selection of a correction region in the generated image frame, wherein the data processor further generates a corrected image frame with a corrected display attribute, by applying a correction value to the selected correction region; and a plurality of displays which display the generated image frame and the corrected image frame, wherein the UI generator generates and displays a third UI to select an image frame displayed in at least one of the plurality of the displays, as a correction target.

16. A display method comprising:

generating an image frame by processing an image signal;

generating a User Interface (UI) to be displayed for a selection of a correction region in the generated image frame; and generating a corrected image frame with a corrected display attribute, by applying a correction value to the selected correction region, wherein the generated UI comprises a selection element displayed within the generated image frame, and wherein the selection element is at least one of a line and a shape, which is manipulated by a user within the generated image frame to select the correction region.

17. The display method of claim 16, further comprising:

receiving the image signal;

displaying the generated image frame;

generating a second UI to be displayed for a selection of a correction value for the display attribute of the selected correction region; where the generating the corrected image frame comprises generating the corrected image frame with the corrected display attribute using the correction value selected on the second UI applied to the selected correction region; and displaying the corrected image frame.

18. The display method of claim 17, wherein the generating the corrected image frame comprises calculating a gain for the display attribute according to the selected correction value, and correcting a display attribute value by multiplying the display attribute value of the image frame by the calculated gain.

19. The display method of claim 18, wherein the generating the corrected image frame further comprises lowering the display attribute value of the image frame forming the corrected display attribute value.

20. The display method of claim 18, wherein the display attribute is at least one of a luminance value, a red (R) color value, a green (G) color value, and a blue (B) color value.

21. The display method of claim 16, further comprising: displaying the generated image frame; and in response to receiving the selected correction region, displaying the corrected image frame, wherein the selected correction region is obtained by receiving a selection using the selection element, the selection indicating a portion of the displayed generated image frame.

22. The display method of claim 16, further comprising: displaying the generated image frame; and in response to receiving the selected correction region, displaying the corrected image frame, wherein the selection element is at least one of a vertical line and a horizontal line which is manipulated on the generated image frame to visually define the correction region.

23. The display method of claim 16, wherein the correction region is an edge region of the generated image frame.

24. The display method of claim 16, wherein the correction region is a plurality of consecutive vertical lines within the generated image frame based on the selection of at least one vertical line via the selection element or a plurality of consecutive horizontal lines located within the generated image frame based on the selection of at least one horizontal line via the selection element.

25. The display method of claim 16, further comprising: displaying the generated image frame; and in response to receiving the selected correction region, displaying the corrected image frame, wherein the selection element is a shape which corresponds to a shape of the generated image frame, which is manipulated on the generated image frame to visually define the correction region.

26. The display method of claim 16, further comprising displaying the generated image frame on a plurality of displays.

27. A non-transitory computer readable medium storing executable instructions for implementing a method of claim 16.

28. The method of claim 16, further comprising lowering the display attribute value of the image frame forming a corrected display attribute value.

29. A display method comprising:
generating an image frame by processing an image signal;
generating a User Interface (UI) to be displayed for a selection of correction regions in the generated image frame; and
generating a corrected image frame with a corrected display attribute, by applying a correction value to the selected correction regions,
wherein, when the selected correction regions are discontinuous, the generating the corrected image frame comprises calculating a correction value for a region between the selected correction regions using a correction value of the selected correction region.

30. A display method comprising:
generating an image frame by processing an image signal;
displaying the generated image frame on a plurality of displays;
generating a User Interface (UI) to be displayed for a selection of a correction region in the generated image frame;
generating a corrected image frame with a corrected display attribute, by applying a correction value to the selected correction region; and
generating a third UI to select an image frame displayed in at least one of the plurality of the displays, as a correction target.

31. A display method comprising:
generating an image frame by processing an image signal;
generating a User Interface (UI) to be displayed for a selection of a correction region in the generated image frame;
generating a corrected image frame with a corrected display attribute, by applying a correction value to the selected correction region;
displaying the generated UI in which the corrected region is selected by manipulating at least one displayed line within the generated image frame;
generating a second UI for a selection of a correction value for the display attribute of the selected correction region; and
displaying the second UI within the generated image frame, where the location of the displaying the second UI varies based on the selected corrected region.

32. The display method of claim 31, wherein the correction value is a relative number and wherein based on the relative number, generating incremental correction values for an entire generated image frame.

33. The display method of claim 31, wherein the correction value is an absolute value and wherein based on the absolute number and at least one of minimum or maximum correction value, generating incremental correction values for an entire generated image frame.

* * * * *